United States Patent [19]

Eastwick

[11] Patent Number: 4,946,129
[45] Date of Patent: Aug. 7, 1990

[54] EQUIPMENT HOUSING ASSEMBLIES

[75] Inventor: Frank E. Eastwick, Maidstone, England

[73] Assignee: GEC-Marconi Limited, England

[21] Appl. No.: 272,718

[22] Filed: Nov. 16, 1988

[30] Foreign Application Priority Data

Nov. 18, 1987 [GB] United Kingdom ............... 8727007

[51] Int. Cl.⁵ ........................................ F16M 13/00
[52] U.S. Cl. .................................. 248/680; 267/136; 312/346
[58] Field of Search ............... 248/560, 562, 564, 694, 248/544, 551, 680, 681, 200, 201, 220.2, 221.3, 500, 506; 403/328, 327, 13, 380; 267/136; 70/58; 312/343, 346; 410/77, 81

[56] References Cited

U.S. PATENT DOCUMENTS

| 479,146 | 7/1892 | Williams | 403/328 |
| 3,116,959 | 1/1964 | Abodeely | 339/66 |
| 4,352,517 | 10/1982 | Bertolini | 410/81 |
| 4,602,890 | 7/1986 | Duda | 403/328 |
| 4,647,245 | 3/1987 | Konsevich | 403/228 |

FOREIGN PATENT DOCUMENTS

| 885924 | 9/1943 | France . | |
| 1288391 | 2/1987 | U.S.S.R. | 403/327 |
| 673092 | 6/1952 | United Kingdom | 410/77 |
| 914368 | 1/1963 | United Kingdom | 410/77 |

Primary Examiner—Alvin C. Chin-Shue
Assistant Examiner—Robert A. Olson
Attorney, Agent, or Firm—Kirschstein, Ottinger, Israel & Schiffmiller

[57] ABSTRACT

An equipment housing assembly includes: an equipment housing (11); a rack (13) for supporting the housing (11); and two spaced hold-down devices (17a, 17b) each comprising two co-operating separable parts (19a, 19b) secured respectively to the rear (21) of the housing (11) and the rack (13). The two parts (19a, 19b) of each device (17a, 17b) have co-operating parallel inclined planar surfaces (23a, 23b) angled to provide a hold-down force (H), and one part (19b) of each device is spring loaded to accommodate manufacturing variations in the front-to-back dimensions of the housing (11) and the rack (13).

10 Claims, 3 Drawing Sheets

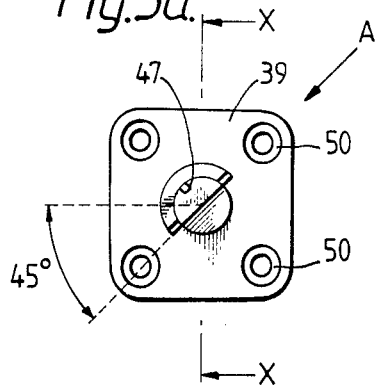
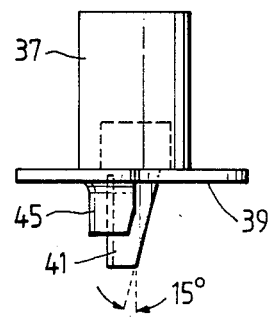
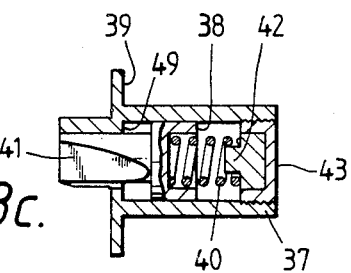
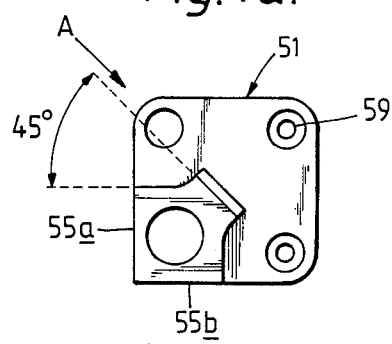
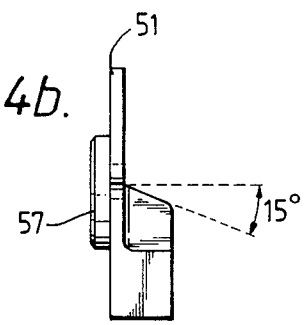
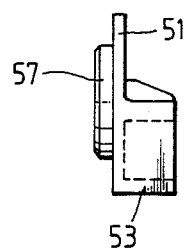

EQUIPMENT HOUSING ASSEMBLIES

BACKGROUND OF THE INVENTION

This invention relates to equipment housing assemblies and to hold-down devices for use with such assemblies.

SUMMARY OF THE INVENTION

It is an object of the present invention to provide an equipment housing assembly wherein the equipment is held down in the housing in such a manner that movement of the equipment with respect to the housing under vibration is less likely to occur than in comparable known assemblies.

According to the present invention there is provided an equipment housing assembly comprising: an equipment housing; a frame structure for supporting said housing including means for guiding the housing for movement rearwardly and forwardly in a first direction with respect to the frame structure for the purpose of permitting releasable engagement of the housing within and withdrawal of the housing from the frame structure; and, between the frame structure and the housing, first and second hold-down devices spaced apart in a second direction transverse to said first direction and each comprising two co-operating separate parts one secured projecting rearwardly in said first direction from the rear of the housing, and the other secured projecting forwardly in said first direction from the frame structure, one of the said parts of each said device being spring biassed in said first direction, characterised in that the two said parts of each said device have contacting parallel inclined planar surfaces, each of said surfaces having: a first component of inclination with respect to said first direction such that, when the housing is moved in said first direction for the purpose of releasable engagement of the housing within the frame structure, the spring biassed part of the said device is displaced in the said first direction against the bias under contact pressure between the parallel surfaces one on each part thereby to accommodate variations in the displacement of the housing in the said first direction with respect to the frame structure, being variations arising as a result of manufacturing tolerances between the housing and the frame structure; and a second component of inclination with respect to said second direction such that the parts secured projecting rearwardly from the housing are respectively subject to hold-down forces, developed at the said contacting parallel surfaces regardless of the respective displacement of the spring biassed part of the device, having components acting in opposite senses in said second direction.

BRIEF DESCRIPTION OF THE DRAWINGS

One equipment housing assembly in accordance with the present invention will now be described, by way of example, with reference to the accompanying drawings in which:

FIG. 3a is an end elevation of a first part of one of the two hold-down devices;

FIG. 3b is a view in the direction of the arrow A in FIG. 3a;

FIG. 3c shows an axial cross-section on the line X—X in FIG. 3a;

FIG. 4a shows an end elevation of a second part of the one of the two hold-down devices;

FIG. 4b is a view in the direction of the arrow A in FIG. 4a; and

FIG. 4c is a side elevation of the second part.

DETAILED DESCRIPTION OF THE PREFERRED EMBODIMENT

Figure 1:
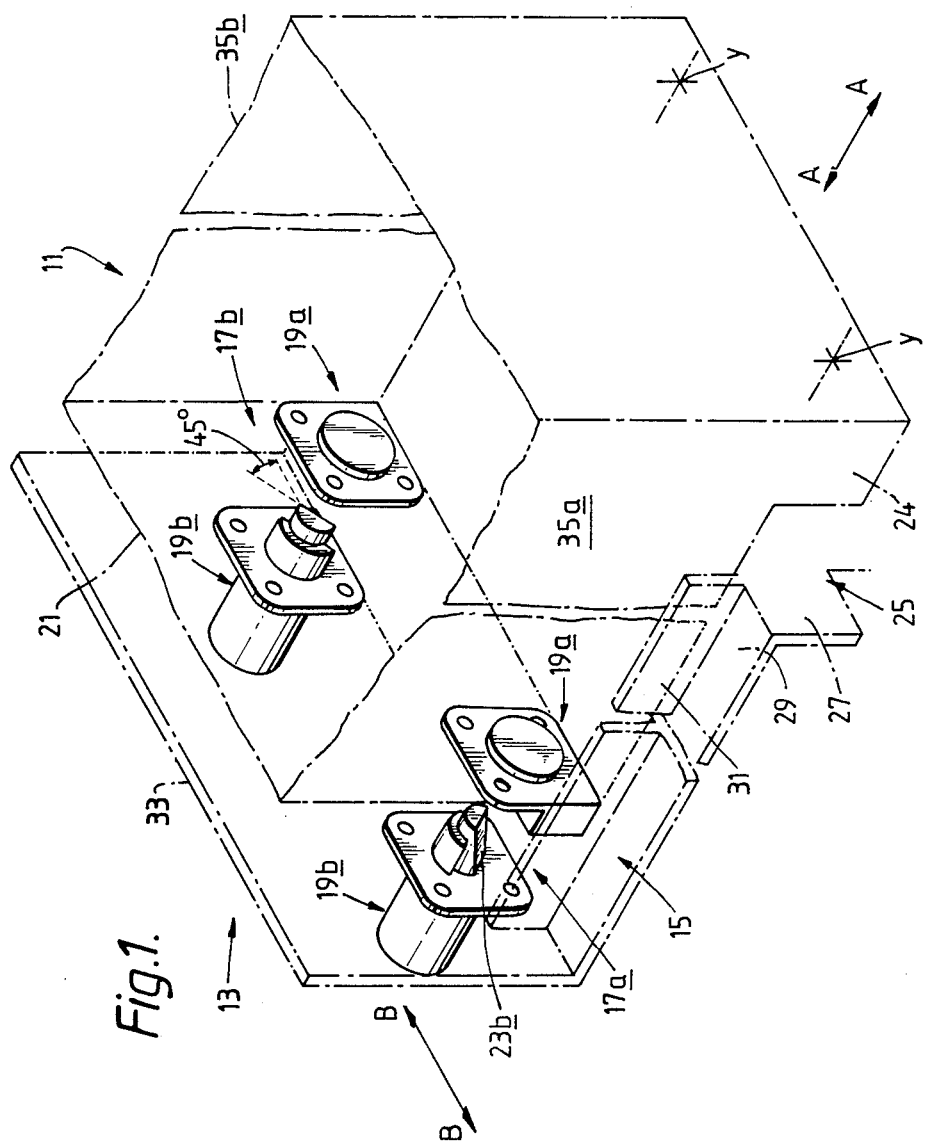
FIG. 1 is a diagrammatic isometric first view of the assembly showing two hold-down devices of the assembly.
Figure 2:
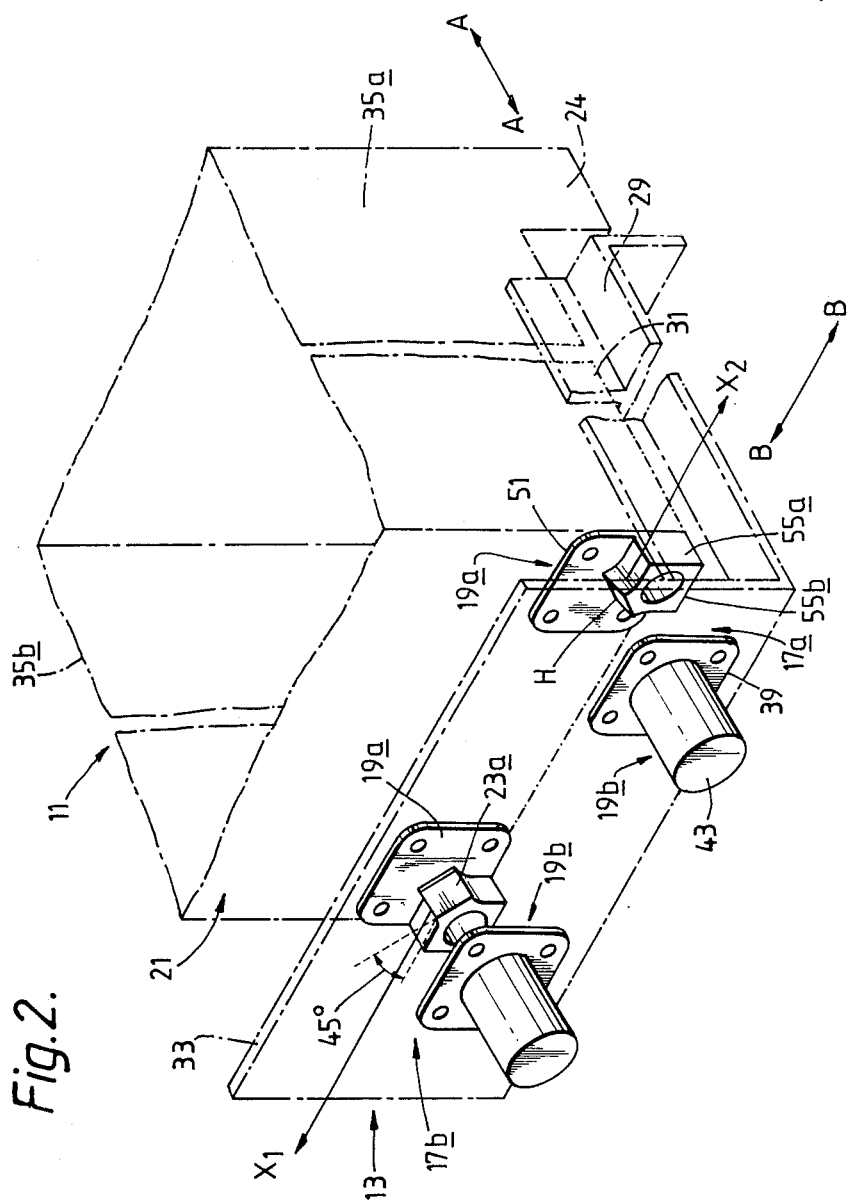
FIG. 2 is a diagrammatic isometric second view of the assembly showing the two hold-down devices.

Referring to FIGS. 1 and 2, the assembly is intended for use as part of a system in an aircraft comprising a multiplicity of equipments respectively contained in housings, of which only one 11 is depicted, and a frame structure or rack 13 for supporting the housings. The rack 13 has means 15 associated with each housing for guiding the housing for movement in opposite senses parallel to a first direction A—A with respect to the rack 13 for the purposes of permitting releasable engagement of the housing within and withdrawal of the housing from the rack.

Referring also to FIGS. 3a, 3b, 3c, 4a, 4b and 4c, between the rack 13 and each housing 11 there are first and second hold-down devices 17a, 17b, spaced apart in a direction (B—B) perpendicular to the direction (A—A).

Each hold-down device comprises two co-operating separate parts 19a, 19b one 19a being secured projecting rearwardly in the first direction A—A from the rear 21 of the housing 11 and the other 19b being secured projecting forwardly in the direction A—A from the rack 13.

In each hold-down device 17a, 17b one 19b of the parts 19a, 19b, is spring biassed in the first direction A—A.

The parts 19a, 19b, of each hold-down device have contacting inclined parallel planar surfaces 23a, 23b. Each of these surfaces has a first component of inclination such that, when the housing 11 is moved in the direction A—A for the purpose of permitting releasable engagement of the housing 11 within the rack 13, the spring biassed part 19b is displaced in the direction A—A, against the bias, under contact pressure between the two surfaces 23a, 23b, one on each part 19a, 19b. This displacement accommodates variations in the displacement of the housing 11, particularly the rear 21 thereof, in the direction A—A such as may arise as a result of manufacturing tolerances between the housing 11 and the rack 13. Each of the surfaces also has a second component of inclination such that the part 19a is subject to a hold-down force H, developed at the contacting parallel surfaces regardless of the displacement of the spring biassed part 19b. The last essential feature of the assembly is that the first and second hold-down devices 17a, 17b, are so disposed that the aforementioned second components of inclination for the two devices 17a, 17b are such that the hold-down forces H exerted by the first and second hold-down devices 17a, 17b respectively have components $X_1$, $X_2$ acting in opposite senses in the direction B—B on the housing 11.

The housing 11 has frontally disposed abutment means 24 which by contact with correspondingly located parts 25 of the rack 13 limit movement of the housing 11 with respect to the rack 13 thereby to define the position of the housing 11 for releasable engagement with the rack 13.

The abutment means 24 comprises a downwards extension spanning the width of the housing 11; and the corresponding parts 25 of the rack 13 are contained in a rack abutment face 27. The housings 11 are adapted to be front clamped to the rack 13 by securing means (not shown), typically in the form of threaded male members engaging corresponding threaded female members at locations Y on the housing front.

The inclination of the contacting parallel surfaces 23a, 23b of the two parts 19a, 19b, of each hold-down device 17a, 17bis, when the parts 19a, 19b, are made of conventional materials e.g. stainless steel such that the first component of inclination is about 15 degrees with respect to the direction A—A and the second component of inclination is about 45 degrees with respect to the direction B—B. In practice the permitted angle for the first component of inclination is determined by the coefficient of friction between the contacting surfaces 23a, 23b. Smaller angles of the first component of inclination may give rise to a friction lock preventing displacement of the parts 19b in the direction A—A, and hence movement of the housing 11 relative to the rack 13, thereby preventing subsequent removal of the housing. Smaller angles of the first component of inclination not giving rise to a friction lock also adversely affect the versatility of the arrangement in that too great a movement of the parts 19b in the direction A—A may, depending on tolerance build-up, be necessary.

On the other hand substantially larger angles for the first component of inclination can adversely affect the hold-down force arising from the second angle of inclination with the result that, under vibration, the rear of the housing 11 may lift.

The rack 13 comprises an L-shaped structure with the aforementioned rack abutment face 27 projecting downwards from the front of a platform portion 29 of the rack 13. The guide means 15 comprises guide rails 31 spaced a little further apart than the width of the housing 11 serving to guide the housing 11 for movement in either sense parallel to the direction A—A. The rear of the rack 13 is constituted by a plate portion 33 upstanding vertically from the platform portion 29.

To maximise the hold-down rigidity of the housing 11, the parts 19a of the hold-down devices 17a, 17b, are secured to the rear of the housing 11 and the parts 19b to the rack 13, specifically at the bottom corners of the upstanding vertical plate portion 33. Moreover the inclinations of the contacting parallel surfaces 23a, 23b of the parts 19a, 19b are such that the hold-down forces H each act in a direction inclined towards the side 35a or 35b of the housing 11 nearer the relevant hold-down device 17a, 17b.

With the contacting parallel faces 23a, 23b so orientated and with the hold-down devices 17a, 17b located at the bottom corners between the plate portion 33 and the housing rear 21, i.e. as widely spaced apart as is possible transverse to the direction A—A in the arrangement shown, the hold-down rigidity is at a maximum.

Referring particularly to FIGS. 3a, 3b and 3c, each of the parts 19b comprises a spring box comprising a hollow cylindrical body portion 37 having a square part mounting flange 39. A plunger 41 extends from the interior of the cylindrical portion 37 and has within the interior a cupped end portion 38. A preloaded helical spring 40 is trapped between the portion 38 and a central locating spigot 42 of an end cap 43 secured, by screw engagement, within the interior at the end remote from the flange 39.

Axially extending from the flange 39 at the side thereof remote from the cylindrical body portion 37 there is a semi-cylindrical raised portion 45 which extends for a substantial distance along the plunger 41, even when in the fully projecting condition as shown in FIG. 3b. The semi-cylindrical portion 45 acts as a bearing member, reacting side loads on the plunger 41.

A longitudinal ridge 47 extending the length of the semi-cylindrical portion 45 and a complementary slot in the plunger 41 constitute an axial guide for the plunger 41. A shoulder 49 at the inner end of the ridge 47 limits outward axial movement of the plunger 41 from the interior of the body portion 37.

The body portions 37 of the parts 19b act as mounting spigots and project through apertures in the plate portion 33 of the rack 13, and are secured to the plate portion 33 by screws passing through mounting holes 50 in the flanges 39 of the body portions 37.

Referring particularly to FIGS. 4a, 4b and 4c, each of the parts 19a is, in end elevation, substantially square and has a plate portion 51 and, occupying one quarter thereof, a raised portion 53. The side orthogonal surfaces 55a, 55b of the raised portion 53 are arranged, in the assembly, to contact respectively an inwards facing surface of a guide rail 31 and a surface of the platform portion 29 of the rack 13, the surfaces 55a, 55b acting as slipper pads in the movement of the housing 11 in the first direction A—A.

The part 19a has a mounting spigot 57 which, in the assembly, is received in a locating hole in the rear 21 of the housing 11. As with the part 19b, the part 19a is secured by screws, passing through mounting holes 59 in the plate portion 51, to the said rear 21 of the housing 11.

I claim:

1. An equipment housing assembly comprising: an equipment housing; a frame structure for supporting said housing including means for guiding the housing for movement rearwardly and forwardly in a first direction with respect to the frame structure for the purpose of permitting releasable engagement of the housing within and withdrawal of the housing from the frame structure; and, between the frame structure and the housing, first and second hold-down devices spaced apart in a second direction transverse to said first direction and each comprising two co-operating separate parts one secured projecting rearwardly in said first direction from the rear of the housing, and the other secured projecting forwardly in said first direction from the frame structure, one of the said parts of each said device being spring biassed in said first direction, the two said parts of each said device having contacting parallel inclined planar surfaces each of said surfaces having a first component of inclination with respect to said first direction such that, when the housing is moved in said first direction for the purpose of releasable engagement of the housing within the frame structure, the spring biassed part of the said device is displaced in the said first direction against the bias under contact pressure between the parallel surfaces one on each part thereby to accommodate variations in the displacement of the housing in the said first direction with respect to the frame structure, being variations arising as a result of manufacturing tolerances between the housing and the frame structure; and a second component of inclination with respect to said second direction such that the parts secured projecting rearwardly from the housing are respectively subject to hold-down forces, developed at the said contacting parallel surfaces regardless of the respective displacement of the spring biassed part of the device, having components acting in opposite senses in said second direction.

2. An assembly according to claim 1 wherein the housing has frontally disposed abutment means which, by contact with correspondingly located parts of said frame structure, limit movement of the housing with respect to the same frame structure so as to define the position of the said housing for releasable engagement within the frame structure.

3. An assembly according to claim 1 wherein: said first direction is perpendicular to said second direction; said first component of inclination is substantially 15 degrees; and said second component of inclination is substantially 45 degrees.

4. An assembly according to claim 1 wherein the said component of the hold-down force exerted by each said device, acts in a direction towards the side of the housing nearer that device.

5. An assembly according to claim 1 wherein said means for guiding comprises first and second guide rails for guiding the housing for movement in said first direction and the parts of the hold-down devices secured projecting rearwardly from the housing are secured at the bottom corners of the rear of the housing and each have orthogonal bottom and side planar surfaces, the bottom said surface constituting a slipper surface for the housing in contact with a horizontal inwardly projecting guide rail surface and the side surface constituting a slipper surface in contact with a vertical inwardly facing guide rail surface.

6. An assembly according to claim 1 wherein each said spring biassed part comprises: a spring box; a piston projecting from the spring box on which said inclined planar surface is provided; a flange part rigid with the spring box; and a part extending from the flange part and having a bearing surface adjacent to a surface portion of the piston such that forces acting on the piston as a result of contact between the inclined parallel surfaces of the two parts of the device are reacted by contact between the said bearing surface and the adjacent said surface portion.

7. A housing hold-down device comprising first and second parts adapted to be secured one to a housing and the other to a frame structure supporting the housing to exert a hold-down force on the housing when the housing is inserted into the frame structure by movement in a first direction with respect to said frame structure; said first part comprising a first portion adapted to be secured to one of said housing and frame structure and a second portion mounted on said first portion for spring biassed movement with respect thereto in said first direction and having a planar surface having a first component of inclination at an angle to said first direction and a second component of inclination at an angle to a direction transverse to said first direction, and said second part being adapted to be secured to another one of said housing and frame structure and having a planar surface inclined so as to be in contacting parallel relationship with said planar surface of said first part with the two parts respectively secured to the housing and the frame structure and said housing inserted in the frame structure.

8. A hold-down device according to claim 7 wherein: said first direction is perpendicular to said second direction; said first component of inclination is substantially 15 degrees; and said second component of inclination is substantially 45 degrees.

9. A hold-down device according to claim 7 wherein said second part further includes two orthogonal surfaces which, with said two parts respectively secured to said housing and frame structure, are parallel to said first direction so as to be adapted to slide on guide surfaces on said frame structure as the housing is inserted into and removed from the frame structure.

10. A housing hold-down device according to claim 7, wherein said first portion of said first part comprises: a spring box; a flange part rigid with the spring box; and a part extending from the flange part and having a bearing surface and said second portion of said first part comprises a piston projecting from the spring box on which said inclined planar surface of the first part is provided, said bearing surface being adjacent to a surface portion of the piston such that forces acting on the piston as a result of contact between the inclined parallel surfaces of the two parts of the device are reacted by contact between the said bearing surface and the adjacent said surface portion.

* * * * *